United States Patent [19]

Moulin et al.

[11] Patent Number: 4,949,091
[45] Date of Patent: Aug. 14, 1990

[54] SPECTRUM ANALYSIS ARRANGEMENT AND AUTOMATIC INTERCEPTION RECEIVING STATION COMPRISING SUCH AN ARRANGEMENT

[75] Inventors: Pierre Moulin; Guy Delevacque, both of Paris, France

[73] Assignee: Thomson CSF, Paris, France

[21] Appl. No.: 23,528

[22] Filed: Mar. 9, 1979

[30] Foreign Application Priority Data

Mar. 14, 1978 [FR] France ................................. 78 07278

[51] Int. Cl.⁵ ........................ H03J 7/32; G01R 23/175
[52] U.S. Cl. .................................... 342/192; 324/77 C
[58] Field of Search ............... 324/77 B, 77 C, 77 CS, 324/77 E, 77 H; 342/13, 192

[56] References Cited

U.S. PATENT DOCUMENTS 2,965,896 12/1960 Wright et al. .................. 342/192 X
3,924,182 12/1975 Jensen ............................ 342/192 X Primary Examiner—Gilberto Barron, Jr.
Attorney, Agent, or Firm—Cushman, Darby & Cushman

[57] ABSTRACT

The spectrum analysis arrangement according to the invention covers a filtering and coupling network comprising a setr of narrow pass band filters, with neighboring center frequencies in steps, whose outputs are coupled one to another through delay devices enabling a resultant signal to be obtained which, at each instant, is the sum of the responses of each filter to the same frequency received at different instants by the analysis receiver fitted with a linearly wobulated oscillator. Application to automatic interception stations in order to obtain precise data quickly on the characteristics of transmission spectra to be identified.

5 Claims, 3 Drawing Sheets

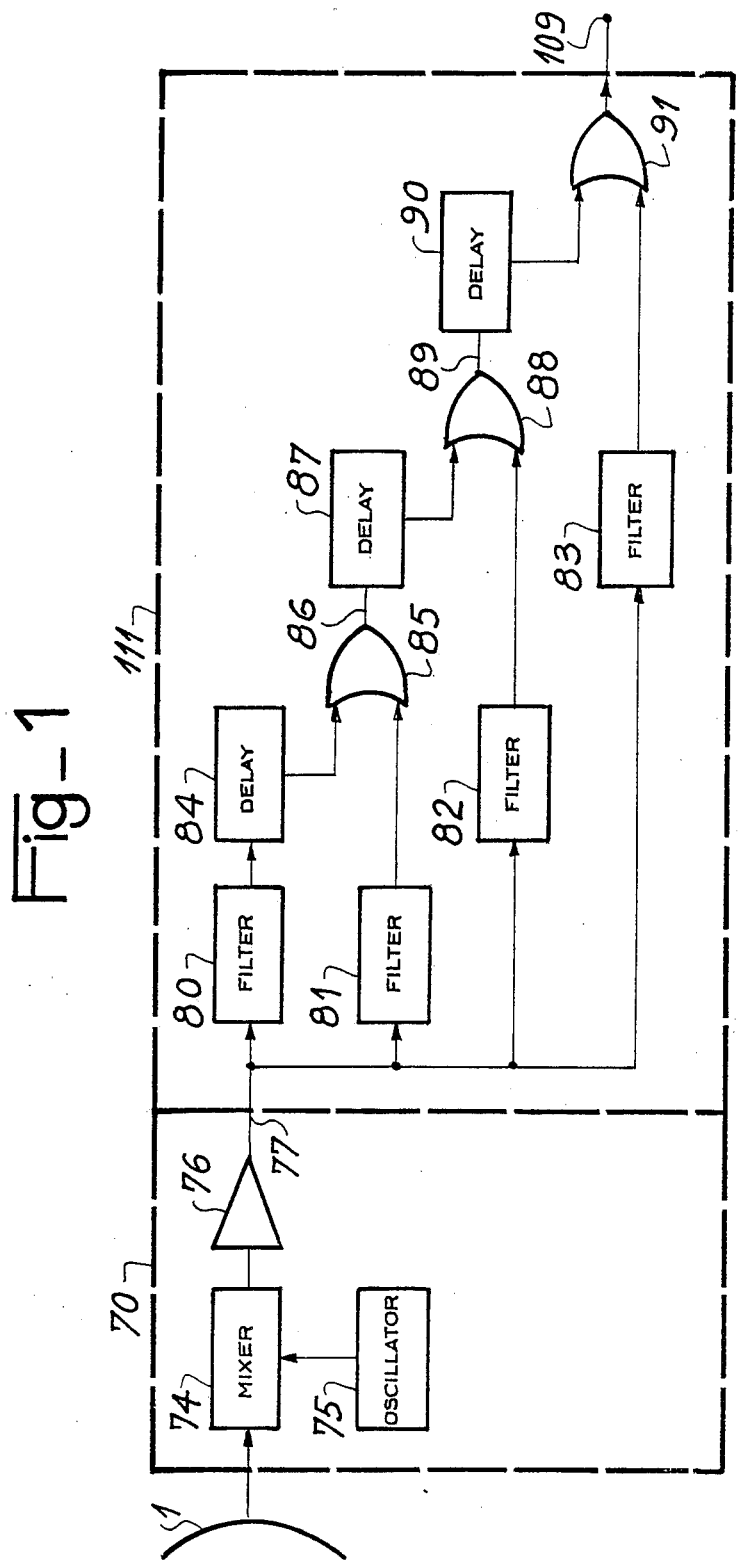

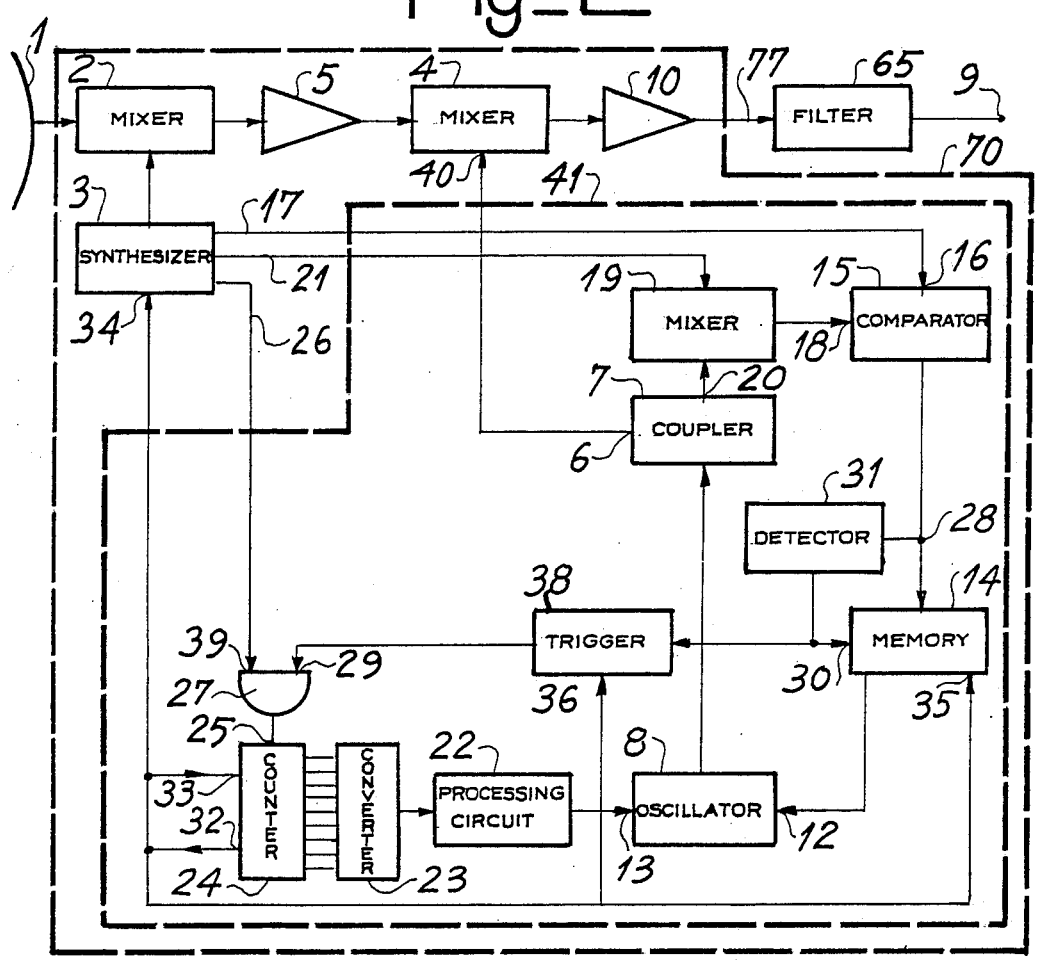
Fig_2
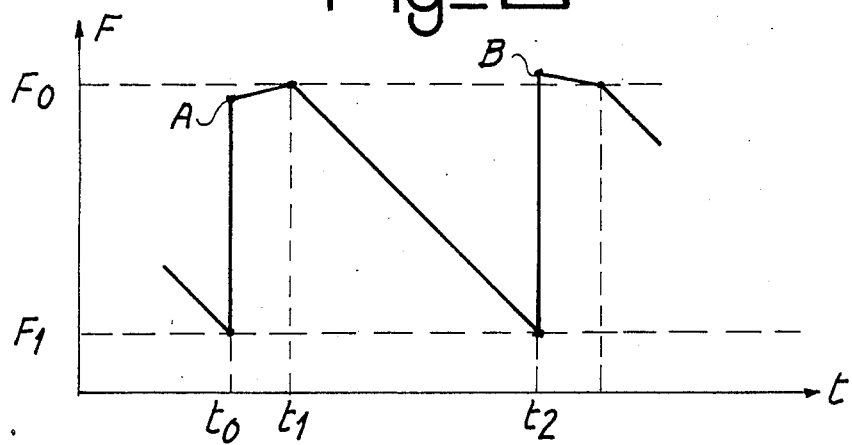
Fig_3

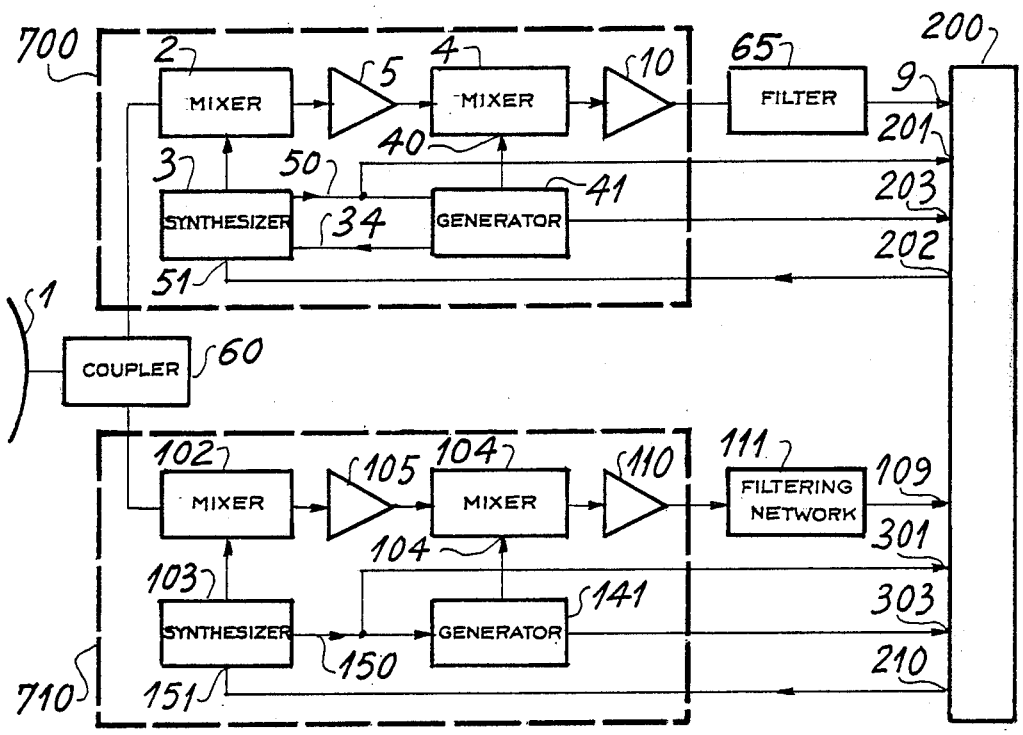
Fig_4
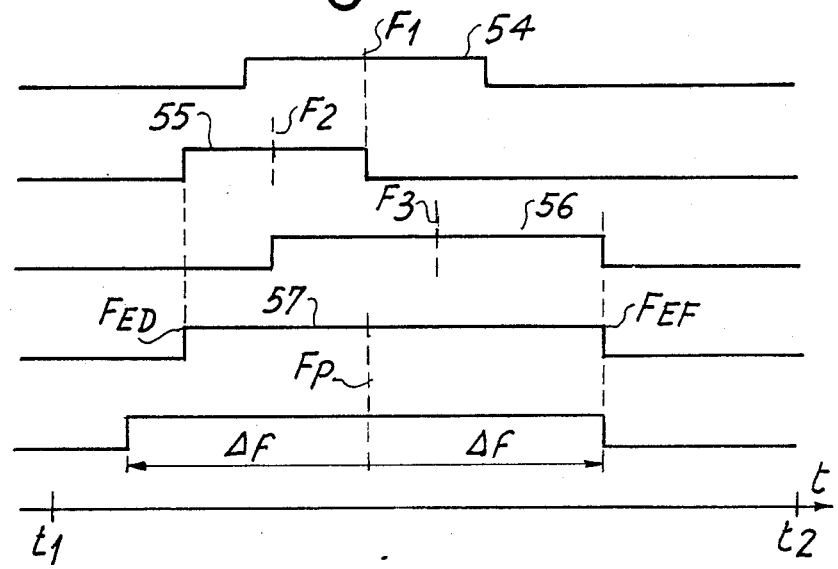
Fig_5

SPECTRUM ANALYSIS ARRANGEMENT AND AUTOMATIC INTERCEPTION RECEIVING STATION COMPRISING SUCH AN ARRANGEMENT

The present invention covers spectrum analysis arrangements intended for the reconnaissance of radio-electrical transmissions and their characteristics and, in particular, automatic interception receiving stations comprising such arrangements which allow quick sweeping over a wide frequency band.

Known spectrum analysis arrangements contain mainly a narrow band pass filter at a fixed frequency, which is preceded by one or more frequency converters each containing a local oscillator, whose frequency is varied continuously or in steps to allow a wide frequency band to be swept.

The operators of such arrangements usually wish to make these analyses as quickly as possible but the interference noise peaks and the characteristics, which vary with time, of the spectra of the transmissions analyzed, which are usually modulated, force them to make several measurements in succession for comparison with one another and this takes a lot of time.

The purpose of the invention is to alleviate these drawbacks.

According to the invention, there is provided a spectrum analysis arrangement comprising: an analysis receiver having an input and an output, an antenna coupled to said receiver input, and a filtering and coupling network having an input coupled to said receiver output, and an output forming the output of said arrangement; said receiver comprising a main frequency converter having an input coupled to said receiver input and an output, and a main intermediate frequency amplifier having an input coupled to said converter output and an output coupled to said receiver output; said converter including a saw-tooth wobulated local oscillator sweeping a frequency range equal to $P_0$, said amplifier having a bandwidth equal to $b_0 < P_0$ and said network comprising n filter devices, n being greater than 1, each filter device having an input coupled to said network input and an output, each filter device comprising a band filter connected in series with an output detector, then n filter device outputs being coupled to said network output through coupling means comprising $(n-1)$ delay devices, the bandwidth of said n band filters being roughly the same, $b < < b_0$, and their band center frequencies distributed over said bandwidth $b_0$ so that the arrangement output supplies, at a given time, the logic sum of the output signals delivered by each of the n filter devices, the delay in each of the $(n-1)$ delay devices being such that each of said n output signals corresponds to the same frequency received by the receiver at n separate instants.

The invention will be better understood and other characteristics will appear from the following description and the drawings referring to it in which:

FIG. 1 is a schematic diagram of an analysis arrangement in accordance with the invention, FIG. 2 is a more detailed diagram of the FIG. 1 diagram, FIG. 3 is an explanatory diagram, FIG. 4 is a schematic diagram of an automatic receiving station using two analysis devices as in FIGS. 1 and 2 respectively, FIG. 5 is an explanatory diagram.

In FIG. 1 an antenna 1 feeds an analysis receiver 70 followed by a filtering and coupling network 111.

Receiver 70 is shown in the most elementary form; a mixer 74, fed by antenna 1, receives a heterodyne signal from a wobulated oscillator 75 and supplies an intermediate frequency signal to the amplifier 76 whose output terminal 77 is connected to the input of network 111.

This contains four narrow band pass filters 80 to 83 fed in parallel; each of these filters is terminated by a detector device, included in the filter, which is a phase discriminator in the example described. The output of filter 80 is coupled to that of the next one 81 through a delay circuit 84 in series with a logic OR circuit 85 whose output 86 is coupled to that of filter 82 through a delay circuit 87 and an OR circuit 88. Finally, the output 89 of this circuit is coupled to that of filter 83 through a delay circuit 90 in series with an OR circuit 91 whose output 109 is that which is common to network 111 and the analysis arrangement described.

Such an arrangement has been tested with an intermediate frequency, at the output of mixer 74, of 18 MHz, the useful bandwidth of 15 kHz being covered by band pass filters 80 to 83 whose centre frequencies are respectively 17,994-17,996-18,002 and 18,006 and whose bandwidth is the same, 3 kHz.

Wobulated oscillator 75 has a linear saw-tooth frequency variation law within a 200 kHz range and a sweep speed of 8 kHz per msec in the range 302-301.8 MHz, which therefore enables the 320-319.8 band to be analyzed.

Assume, for example, that a signal, whose frequency is 319.9 MHz, has been received by the analysis arrangement. This signal correspond to the centre frequency of filter 80 when oscillator 75 produces a frequency of 301.906 MHz, then to that of filter 81 when oscillator 75 produces a frequency of 301.902 MHz, i.e.

$$\frac{1 \times 4}{8} = 0.5$$

msec later, and so on, filter 83 being reached 1.5 msec after filter 80.

Hence, by giving delays of 0.5 msec each to delay circuits 84, 87 and 90, a single signal will be picked up at output 109 during the sweep but it will correspond in fact to reception at four separate instants at 0.5 msec intervals.

Since the sweep of oscillator 75 is linear, this coincidence will occur for each frequency throughout the reception range. The obtaining of this linear sweep requires circuits correcting the control voltage for the oscillator concerned.

These may be avoided by using any sweep law but, in this case, the delay in circuits 84, 87 and 90 must be variable and enslaved to the corresponding non-linear sweep law.

The arrangement described is evidently not very interesting for the reception of pure stable carrier frequencies. However, in practice, it is generally a question of recognising modulated signals whose frequency components vary continuously. The determination as exactly as possible of the width of this spectrum normally requires several sweeps which, with the system described, will be much reduced since, in a single sweep, the sum of the responses of four sweeps carried out at 0.5 msec intervals will be obtained.

Such an arrangement can be used for automatic sweeping of a wide frequency band by fitting it in an automatic interception station containing two analysis arrangements one of which is assigned to fast, continuous sweeping over a wide frequency band while the other makes a fines analysis of the transmissions detected by the first and contains the arrangement in accordance with the invention which is described above.

These two analysis arrangements must have a more elaborate analysis receiver than receiver 70. It is described below as intended for fast continuous sweeping.

In FIG. 2, antenna 1 and receiver 70 correspond to the items with the same numbers in FIG. 1 but filter network 111 in this FIG. 1 is replaced by a simple narrow band pass filter 65 which contains an output detector in the form of a phase discriminator whose output 9 is also that of the analysis arrangement described and, above all, the construction of receiver 70 is different. It consists of a mixer 2 fed by antenna 1 which converts the frequency of the signals received by means of a local oscillator in the form of a synthesizer 3. The output of mixer 2 feeds a second mixer 4 through a first intermediate frequency amplifier 5. Mixer 4 receives at a second input 40 a local oscillation signal supplied by a generator 41 and feeds the receiver output terminal 77 through a second intermediate frequency amplifier 10.

Generator 41 contains an oscillator 8 whose frequency is electronically controlled and which feeds a coupler 7 whose output 6 is connected to input 40 of mixer 4. Oscillator 8 is controlled in frequency by its control inputs 12 and 13. Input 12 is connected through the memory 14 to the output 28 of the comparator 15 whose input 16 is connected to the output 17 of synthesizer 3 while its input 18 is connected to the output of the mixer 19 which converts the frequency of the signal supplied by oscillator 8 through the output 20 of coupler 7 by means of a heterodyne signal supplied by the output 21 of synthesizer 3.

The input of control 13 is connected, through a processing circuit 22, to the output of a digital-analog converter 23 which is coupled to the signal outputs of a digital down-counter 24 whose clock input 25 receives, from the output 26 of synthesizer 3 through one 39 of the two inputs of an AND gate 27, a clock signal whose transmission is controlled by the other input 29 of gate 27. Comparator 15 also feeds a detector circuit 31 whose output is connected to a first control input 30 of memory 14 on the one hand and to input 29 through a bistable trigger circuit 38 on the other.

Down-counter 24 has an output 32 which delivers a pulse when it is empty and is connected to its loading control input 33 and to the control inputs 34 to 36 of synthesizer 3, memory 14 and trigger circuit 38 respectively.

The receiver described has been tried in a range of frequencies received from 20 to 120 MHz. Synthesizer 3 supplies a variable frequency signal in the range 340–440 MHz in 0.5 MHz steps; the differential beat of these frequencies is used at the output of mixer 2 where it is selected and amplified by amplifier 5 which is tuned to the first intermediate frequency of 320 MHz.

Oscillator 8 has a standby frequency of 302 MHz. At the output of mixer 4 the differential beat is also used and a second intermediate frequency of 18 MHz passes through the amplifier 10 and the band pass filter 11 whose bandwidth is 12.5 kHz.

For every tuning frequency of the synthesizer oscillator 8 sweeps a spectrum of 0.5 MHz, which is equal to the synthesizer step and implies that amplifier 5 has a bandwidth of at least 0.5 MHz.

This gives a continuous sweep of the spectrum. At each step of the synthesizer oscillator 8 starts from its standby position and decreases in frequency linearly as a function of time by 0.5 MHz. At the end its sweep, it causes the synthesizer to be placed on the next step and to return to its standby frequency to which it is enslaved with precision before it moves again.

The operation of this process will be better understood from the diagram in the next figure.

In FIG. 3 are shown, as a function of time t, the variations in the frequency F of oscillator 8.

The instant $t_0$ corresponds to the time when down-counter 24 has completed its count and reached zero. This causes the appearance of a pulse at the terminal 32 which causes trigger circuit 38 to switch simultaneously to logic O cutting off gate 27, making the synthesizer switch to the next step and loading down-counter 24 through its input 33. This produces at the output of processing circuit 22 a voltage which is applied to control input 13 corresponding to the standby point of oscillator 8. The oscillator thus switches suddenly from a frequency $F_1$ to a point A very close to a frequency $F_0 = F_1 + 0.5$ MHz. This pulse also reaches the terminal 35 of memory 14 and causes the servo-control loop to close which is formed mainly by mixer 19, comparator 15 and memory 14.

From $t_0$ to $t_1$ comparator 15 supplies, through its output 28, to input 12 of oscillator 8 a correction voltage which results from comparison of the 8 MHz reference signal supplied by output 17 of synthesizer 3 with the signal from oscillator 8 after its conversion to 8 MHz by means of the 312 MHz signal supplied by ouptut 21 of the same synthesizer.

At time $t_1$ oscillator 8 is brough to the exact frequency $F_0$. Locking is converted by detector 31 into a logic 1 which is applied to the control input 30 of memory 14 to cause the recording of the correction voltage applied to terminal 12 and produce, immediately afterwards, the servo-control loop cut-off. This logic 1 is also applied to AND gate 27 through trigger circuit which maintains its presence for gate 27 to enable the counting to continue using the clock signals supplied by output 26 of synthesizer 3 unitl time $t_2$ which corresponds to the end of counting and causes trigger circuit 38 to switch to 0 and cut off gate 27.

In the example described, at time $t_0$, down-counter 24 is loaded to 160 and switches step by step from 160 to 0 between $t_1$ and $t_2$. This number is converted by converter 23 into analog voltage steps which are smoothed by processing circuit 22 whose transfer function is fixed so that the voltage applied to terminal 23 of oscillator 8 ensures a constant frequency change at each step whose value is then 500/160 kHz=3.125 kHz.

At time $t_2$, the cycle starts again and the next loading of the down-counter causes the sudden change in frequency of oscillator 8 from $F_1$ to a frequency B, which is different from A but also very close to $F_0$.

In the example chosen, a clock frequency of 40 kHz was chosen, i.e. a time interval of 25 λsec between pulses and hence a time of $25 \times 160 = 4$ msec for the linear variation of frequency between $t_1$ and $t_2$, i.e. a sweep speed of 125 MHz/Sec. The time interval $t_1 - t_0$ is fixed to enable locking of the servo-control loop to be obtained and the change in step of the synthesizer to occur. One msec is sufficient for this, i.e. a total of 5 msec between two servo-control operations on oscillator 8. Hence, the frequency deviations between points A or B and $F_0$, which are of the same order of size as the precision with which frequency $F_1$ is reached, are negligeable and everything happens as if oscillator 8 were permanently servo-controlled in frequency. The description of the operation above only covers the essential operations. Various habitual practical arrangements must be provided by logic circuits to obtain correct spacing of the operations. For example, if the time $t_0-t_1$, which is here determined by the time required to lock the servo-control loop, is not long enough to allow the synthesizer to change frequency, the down-counter must be cut off as long as this frequency change has not occurred, for example, by cutting off the clock signals delivered at output 26.

Since a complete sweep cycle requires a time interval of 5 msec for 500 kHz, a complete sweep in the range 20—120 MHz only requires 1 sec.

This arrangement is used as the base in the construction of the interception receiving station already mentioned which is described below.

In FIG. 4 the two analysis arrangements in this station contain respectively two analog receivers 700 and 710 which are shown by giving the elements corresponding to those in FIG. 2 the same symbols concerning receiver 700, and these latter increased by 100, concerning receiver 710. The links between these elements are identical with the exception of what follows which concerns mainly their connection to a computer 200.

A coupler 60 enables antenna 1 to be permanently coupled to the input mixers 2 and 102 of the receivers whose outputs of the amplifiers 10 and 110 feed computer 200 through filtering network 65 and 111 respectively, which are identical to the elements with the same numbers in corresponding FIGS. 1 and 2.

In receiver 700 the connection cabel 50 transmits the signals supplied by outputs, 17, 21 and 26 of synthesizer 3, which are shown in FIG. 2, to generator 41 and to the input 201 of computer 200 which also receives the signals supplied at output terminal 9. Computer 200 supplies at its output 202 the control signals for the end frequencies fof the sweep range of synthesizer 3 to which they are applied at an additional input 51 and receives at its input 203 logic data picked up at input 29 of gate 27 (FIG. 2) to oscillator 41.

In receiver 710, a connection cable 150, which is identical to 50, connects, the synthesizer 103 to the generator 141 and to the input 301 of computer 200, which also receives the signals supplied at the output terminal 109 and those supplied at terminal 303, which are of the same kind as those of receiver 70 applied to terminal 203.

Synthesizer 103 is controlled in frequency at its input 151 with signals supplies at the output 210 of computer 200 instead of with signals supplied by oscillator 141.

Receiver 700 is used as the sweep and detection receiver in the same conditions as receiver 70 in FIG. 2. It has the same characteristics except that the upper and lower limits of the sweep range of synthesizer 3 are displayed not on the synthesizer itself but on the computer which records in its memory the results obtained at terminal 9 and the frequencies to which they correspond. These frequencies are determined as a function of time only by the simple counting of clock pulses since their recurrence interval was calibrated at 3.125 kHz, the clock pulses only being taken into account each time the down-counter starts up, information which is transmitted at terminal 203.

Receiver 710 is used as the analysis receiver and it operates on the same principle as the detection receiver except that its synthesizer 103 is controlled in frequency at each sweep of the generator 141 by the output signals of computer terminal 210 from data recorded in the memory as described above, i.e. synthesizer 103 is adjusted in succession to the frequencies detected by receiver 700.

The responses obtained at output terminal 109 of this analysis arrangement are used in the same way as those received at terminal 9; the corresponding frequencies are determined by counting from the clock transmitted to computer iput 301 and the start-up data of its down-counter transmitted at input 303.

In the example chosen receiver 710 has the following characteristics:

step of synthesizer 103:0.0125 MHz
sweep range of generator 141:200 kHz
clock frequency:20 kHz
sweep range for 500 clock pulses, i.e. 500/20.000=25 msec for 200 kHz, i.e. a sweep speed of 8 MHz/sec.

The sweep speed is thus 15 times lower than that in the preceding analysis arrangement. This makes it possible to analyse finely the responses of this arrangement by means of the filter network 111 whose characteristics are identical to those described with FIG. 1, i.e. the analysis window width is 3 kHz and, above all, there is this addition at each instant of the analysis products produced at the four preceding instants in the same spectrum window.

The inclusion of this filter network in the analysis arrangements described enables delay devices 84, 87 and 90 (FIG. 1) to be produced very simply and precisely by means of shift registers.

As the clock frequency included in synthesizer 103 is 20 kHz, its period is 50 $\mu$sec and a 0.5 msec delay will be obtained using a register having 10 stages passed through at the rate of this clock.

Receivers as described may also be used to increase the precision provided by this filter device and to protect it from erratic noises by automatic repetition of the sweep around one of the responses obtained by the detection analysis device, which are here 3 in number. For this purpose it is sufficient to delay the change of step of synthesizer 103 until 3 down-counting instructions in succession have been given to down-counter 24 of oscillator 141.

The next Figure shows an example of the response signals obtained in this case and the use which can be made of them by computer 200.

In FIG. 5 are shown, between the time limits, the start $t_1$ and the end $t_2$, of a frequency sweep in oscillator 141, an example of the spectrum width detected by filtering network 111 on the first sweep in curve 54 and the spectrum widths detected on the second and third sweeps in curves 55 and 56 respectively. Computer 200 records the times corresponding to the beginning and end of the appearance of each of these spectra and calculates for each of them the supposed centre frequency in the form of an arithmetic mean of the end frequencies of each spectrum. Let $F_1$, $F_2$ and $F_3$ be these centre frequencies corresponding to the spectra of curves 54 to 56 respectively. Computer 200 then calculates the arithmetic mean of these three centre frequencies, i.e. $F_P$. This frequency is considered as that of the carrier of the spectrum analyzed. The width of the spectrum is limited by the end frequency which is the furthest away on one side and on the other of this carrier. Let $F_{ED}$ and $F_{EF}$ be these frequencies which are given with $F_P$ in curve 57. If it is known that the spectrum is symmetrical, the general case, for example, of frequency modulated telephonic transmissions, the frequency the furthest away from the carrier is shown symmetrically around frequency $F_P$ as indicated in curve 58 which represents the supposed spectrum of the signals analyzed whose width is $2 \Delta f$.

What is claimed, is:

1. A spectrum analysis arrangement comprising: and analysis receiver having an input and an output, an antenna coupled to said receiver input, and a filtering and coupling network having an input coupled to said receiver output, and an output forming the output of said arrangement; said receiver comprising a main frequency converter having an input coupled to said receiver input and an output, and a main intermediate frequency amplifier having an input coupled to said converter output and an output coupled to said receiver output; said converter including a saw-tooth wobulated local oscillator sweeping a frequency range equal to $P_0$, said amplifier having a bandwidth equal to $b_0 < P_0$ and said network comprising n filter devices, n being greater than 1, each filter device having an input coupled to said network input and an output, each filter device comprising a band filter connected in series with an output detector, the n filter device outputs being coupled to said network output through coupling means comprising (n−1) delay devices, the bandwidth of said n band filters being roughly the same, $b << b_0$, and their band center frequencies distributed over said bandwidth $b_0$ so that the arrangement output supplies, at a given time, the logic sum of the output signals delivered by each of the n filter devices, the delay in each of the (n−1) delay devices being such that each of said n output signals corresponds to the same frequency received by the receiver at n separate instants.

2. An analysis arrangement as claimed in claim 1 wherein the wobulated oscillator frequency variation law is linear in the frequency range $P_0$ and the frequency interval between the centre frequencies of two any band filters having adjacent respective bandwidth is constant in the band $b_0$ and greater than or equal to b, said (n−1) delay means providing and identical delay and said coupling means comprising (n−1) logic OR gates with 2 inputs, the output of the $i^{th}$, $i=3 \ldots n-1$, filter device being coupled to one of said two inputs of the $(i-1)^{th}$ OR gate, the other input of which is coupled to the output of the $(i-2)^{th}$ OR gate through the $(i-1)^{th}$ delay line, the output of the second filter device being coupled to one of said two inputs of the first OR gate, the other input of which is coupled to the first filter device output through the first delay line, and the output of the $n^{th}$ filter device being coupled to one of said two inputs of the $(n-1)^{th}$ OR gate, the other input of which coupled to the output of the $(n-2)^{th}$ OR gate through the $(n-1)^{th}$ delay line, output of said $(n-1)^{th}$ OR gate being coupled to said output network.

3. An automatic interception receiving station comprising a spectrum analysis arrangement as claimed in claim 2, said receiver input being coupled to said main frequency converter input through a further converter connected in series with a further intermediate frequency amplifier, said further converter comprising a local oscillator formed by a step by step frequency synthesizer, which is electronically controlled and whose step $P_0 < P_0$ said further intermediate frequency amplifier having a bandwidth roughly equal to the width of the said frequency range.

4. An interception station as claimed in claim 3 comprising a further analysis receiver coupled to said antenna whose the synthesizer step is roughly equal to the frequency range $P_E$ of its wobulated oscillator, $P_E$ being greater than $P_0$, said further receiver also comprising a detector of the signals supplied by its additional amplifier of bandwidth $b_E > b$.

5. An interception station as in claim 4, further comprising a computer connected to the filter device outputs of each of said analysis receivers, which determines the frequencies received by each of said receivers at each instant when a signal is present at the output of the corresponding filter devices, this computer also containing a memory which records these tuning frequencies and a piloting device of said further receiver that assigns to its synthesizer a series of tuning frequencies corresponding to a predetermined sweep frequency band.

* * * * *